(12) United States Patent
Kim (10) Patent No.: US 10,366,730 B2
(45) Date of Patent: Jul. 30, 2019

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventor: Jaeil Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/816,144

(22) Filed: Nov. 17, 2017

(65) Prior Publication Data

US 2018/0166107 A1 Jun. 14, 2018

(30) Foreign Application Priority Data

Dec. 9, 2016 (KR) .................. 10-2016-0167360

(51) Int. Cl.
*G11C 7/10* (2006.01)
(52) U.S. Cl.
CPC ............ *G11C 7/1012* (2013.01); *G11C 7/106* (2013.01); *G11C 7/1006* (2013.01); *G11C 7/1039* (2013.01); *G11C 7/1066* (2013.01); *G11C 7/1087* (2013.01); *G11C 2207/108* (2013.01)

(58) Field of Classification Search
CPC ... G11C 7/1012; G11C 7/1006; G11C 7/1039; G11C 7/106; G11C 7/1066
See application file for complete search history.

(56) References Cited

U.S. PATENT DOCUMENTS

2002/0118567 A1* 8/2002 Takagi ................ G11C 7/1036
365/185.11

FOREIGN PATENT DOCUMENTS

KR 1020110088929 A 8/2011
WO 2007106710 A2 9/2007

* cited by examiner

*Primary Examiner* — James G Norman
(74) *Attorney, Agent, or Firm* — William Park & Associates Ltd.

(57) ABSTRACT

A semiconductor system includes a semiconductor device. The semiconductor device outputs a first group of data and a second group of data to a first group of input/output (I/O) lines and a second group of I/O lines in response to a command and an address. The second semiconductor device sequentially latches the first group of data loaded on the first group of I/O lines and the second group of data loaded on the second group of I/O lines to generate an output data or simultaneously latches the first and second groups of data loaded on the first and second groups of I/O lines to generate the output data, in response to a burst length information signal.

20 Claims, 8 Drawing Sheets

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Application No. 10-2016-0167360, filed on Dec. 9, 2016, which is incorporated herein by reference in its entirety.

BACKGROUND

1. Technical Field

Embodiments of the present disclosure relate to semiconductor devices and, more particularly, to semiconductor devices receiving and outputting data according to a burst length.

2. Related Art

Semiconductor devices have been continuously developed to operate at a high speed. As a result, the semiconductor devices have been designed to receive and output data in synchronization with an external clock signal. A burst operation corresponds to a typical operation for receiving and outputting the data in synchronization with an external clock signal. According to the burst operation, the semiconductor device may successively receive or output a plurality of data corresponding to a burst length in response to a single write command or a single read command if the burst length is set by a mode register set (MRS).

The burst length (BL), which is set for the burst operation, may have any one of various values such as four, eight, and sixteen. If the burst length (BL) is set to be eight (i.e., BL=8), "8"-bit data may be successively inputted to or outputted from the semiconductor device by a single write command or a single read command.

SUMMARY

Various embodiments are directed to semiconductor devices receiving and outputting data according to a burst length and semiconductor systems including the same.

According to an embodiment, a semiconductor system includes a first semiconductor device and a second semiconductor device. The first semiconductor device outputs a command, an address, and a burst length information signal and receives output data. The second semiconductor device outputs a first group of data and a second group of data to a first group of input/output (I/O) lines and a second group of I/O lines in response to the command and the address. In addition, the second semiconductor device sequentially latches the first group of data loaded on the first group of I/O lines and the second group of data loaded on the second group of I/O lines to generate the output data or simultaneously latches the first and second groups of data loaded on the first and second groups of I/O lines to generate the output data, in response to the burst length information signal.

According to another embodiment, a semiconductor device includes a data processing circuit and a data alignment circuit. The data processing circuit sequentially latches a first group of data loaded on a first group of input/output (I/O) lines and a second group of data loaded on a second group of I/O lines to generate a first group of latched data and a second group of latched data or simultaneously latches the first and second groups of data loaded on the first and second groups of I/O lines to generate the first and second groups of latched data, according to a burst length. The data alignment circuit aligns the first and second groups of latched data to generate output data.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
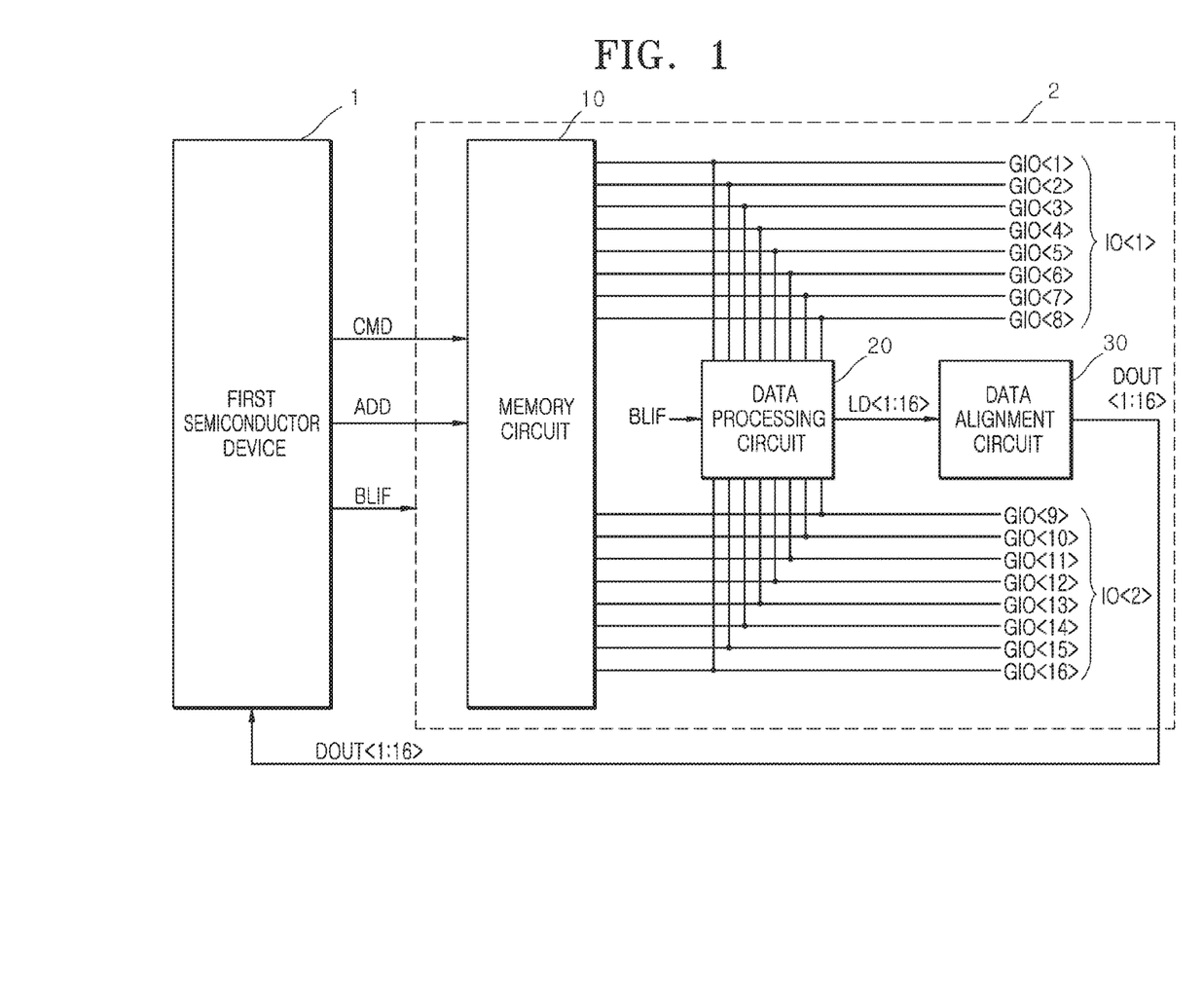
FIG. 1 is a block diagram illustrating a configuration of a semiconductor system according to an embodiment of the present disclosure.

As illustrated in FIG. 1, a semiconductor device according to some embodiments may include a first semiconductor device 1 and a second semiconductor device 2. The second semiconductor device 2 may include a memory circuit 10, a data processing circuit 20, and a data alignment circuit 30.

The first semiconductor device 1 may output a command CMD, an address ADD, and a burst length information signal BLIF. The first semiconductor device 1 may receive output data DOUT<1:16> from the second semiconductor device 2. The command CMD may be transmitted through a signal line that transmits a command and an address and may be set to have a plurality of bits according to the embodiment. The address ADD may be transmitted through a signal line that transmits a command and an address and may be set to have a plurality of bits according to the embodiment. The output data DOUT<1:16> may be set to include a plurality of bits according to the embodiments. The output data DOUT<1:16> may be set to include a plurality of serial data which is successively transmitted through a single data line or may be set to include a plurality of parallel data which is transmitted through a plurality of data lines. The burst length information signal BLIF may be a signal including information on the number of bits of a first group of data (D<1:8> of FIG. 6) and a second group of data (D<9:16> of FIG. 6) which are outputted from the second semiconductor device 2 during a period that the command CMD is inputted to the second semiconductor device 2 once. The burst length information signal BLIF may be enabled if a burst length is set to be eight (i.e., BL=8). In other words, the burst length information signal BLIF may be enabled if the burst length is set to be half the number of total bits of the first and second groups of data (D<1:8> and D<9:16> of FIG. 6). The burst length information signal BLIF may be disabled if the burst length is set to be sixteen (i.e., BL=16). The first data may correspond to the first group of data D<1:8> illustrated in FIG. 6, and the second data may correspond to the second group of data D<9:16> illustrated in FIG. 6.

More specifically, if the burst length is set to be eight (i.e., BL=8), the first group of data (D<1:8> of FIG. 6) having eight bits or the second group of data (D<9:16> of FIG. 6) having eight bits may be successively transmitted while the command CMD is inputted to the second semiconductor device 2 once. If the burst length is set to be sixteen (i.e., BL=16), the first and second groups of data (D<1:16> of FIG. 6) having sixteen bits may be successively transmitted while the command CMD is inputted to the second semiconductor device 2 once.

The memory circuit 10 may output the first and second groups of data D<1:16> to a first group input/output (I/O) lines IO<1> and a second group of I/O lines IO<2> in response to the command CMD and the address ADD. The memory circuit 10 may output the first and second groups of data D<1:16> stored in memory cells (not shown) selected by the address ADD to the first and second groups of I/O lines IO<1:2> during a read operation in response to the command CMD. The memory circuit 10 may output the first group of data D<1:8> to the first group of I/O lines IO<1> during the read operation. The memory circuit 10 may output the second group of data D<9:16> to the second group of I/O lines IO<2> during the read operation. The memory circuit 10 may store data loaded on the first and second groups of I/O lines IO<1:2> into memory cells (not shown) selected by the address ADD during a write operation in response to the command CMD. The first group of I/O lines IO<1> may include first to eighth global lines GIO<1:8>. The number of global lines included in the first group of I/O lines IO<1> may be set to be different according to the embodiment. The second group of I/O lines IO<2> may include ninth to sixteenth global lines GIO<9:16>. The number of the global lines included in the second group of I/O lines IO<2> may be set to be different according to the embodiment. The first group of data D<1:8> may be loaded on the first to eighth global lines GIO<1:8> bit by bit, respectively. The second group of data D<9:16> may be loaded on the ninth to sixteenth global lines GIO<9:16> bit by bit, respectively.

The data processing circuit 20 may latch the first group of data D<1:8> loaded on the first group of I/O lines IO<1> to generate a first group of latched data LD<1:8> in response to the burst length information signal BLIF and may then latch the second group of data D<9:16> loaded on the second group of I/O lines IO<2> to generate a second group of latched data LD<9:16> in response to the burst length information signal BLIF. The data processing circuit 20 may simultaneously or sequentially latch the first group of data D<1:8> loaded on the first group of I/O lines IO<1> and the second group of data D<9:16> loaded on the second group of I/O lines IO<2> to generate the first and second groups of latched data LD<1:16>, in response to the burst length information signal BLIF.

The data alignment circuit 30 may latch and align the first and second groups of latched data LD<1:16> to generate the output data DOUT<1:16> in response to the command CMD and the burst length information signal BLIF. The burst length may correspond to the number of bits included in the output data DOUT<1:16> outputted from the data alignment circuit 30 during a period that the command CMD provided by the first semiconductor device 1 is inputted to the data alignment circuit 30 once.

As described above, the second semiconductor device 2 may output the first and second groups of data (D<1:8> and D<9:16> of FIG. 6) to the first and second groups of I/O lines IO<1> and IO<2> in response to the command CMD and the address ADD. In one example, the second semiconductor device 2 may output the first or second groups of data (D<1:8> and D<9:16> of FIG. 6) as the output data DOUT<1:16> in response to the command CMD if the burst length information signal BLIF is enabled. Further, the second semiconductor device 2 may simultaneously output the first and second groups of data (D<1:8> and D<9:16> of FIG. 6) as the output data DOUT<1:16> in response to the command CMD if the burst length information signal BLIF is disabled. The second semiconductor device 2 may latch the first group of data D<1:8> loaded on the first group of I/O lines IO<1> and may then latch the second group of data D<9:16> loaded on the second group of I/O lines IO<2> to generate the output data DOUT<1:16>, in response to the burst length information signal BLIF. Alternatively, the second semiconductor device 2 may simultaneously latch the first and second groups of data D<1:16> loaded on the first and second groups of I/O lines IO<1:2> to generate the output data DOUT<1:16>, in response to the burst length information signal BLIF.

Figure 2:
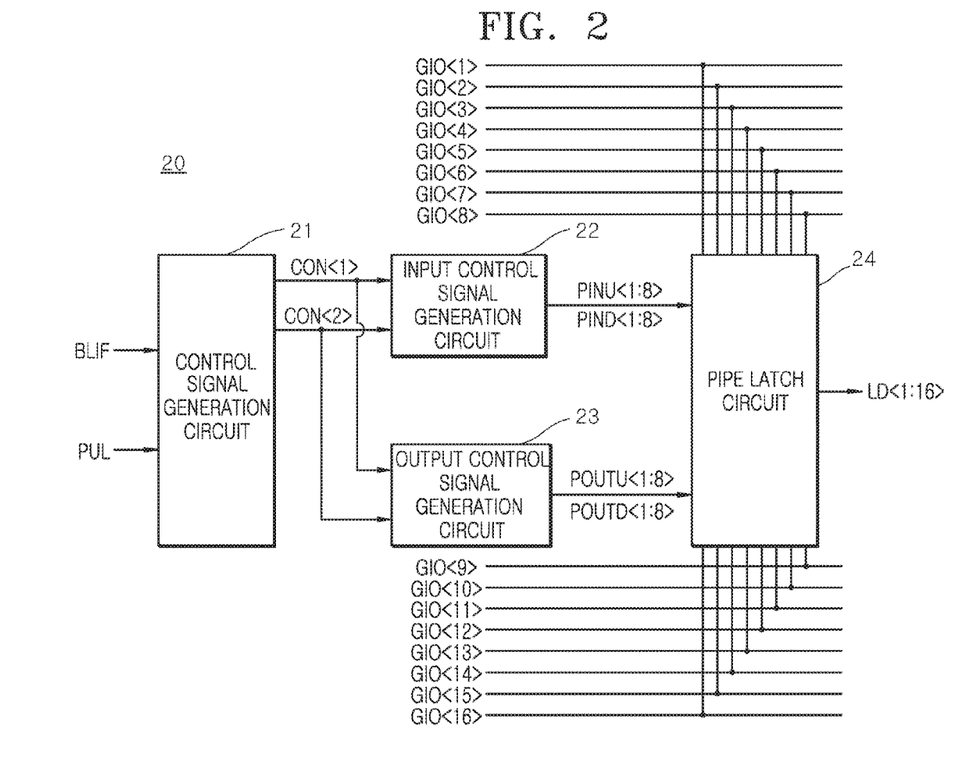
FIG. 2 is a block diagram illustrating an example of a data processing circuit included in the semiconductor system of FIG. 1.

Referring to FIG. 2, the data processing circuit 20 may include a control signal generation circuit 21, an input control signal generation circuit 22, an output control signal generation circuit 23, and a pipe latch circuit 24.

The control signal generation circuit 21 may generate a first control signal CON<1> and a second control signal CON<2> which are sequentially enabled in response to the burst length information signal BLIF and a pulse signal PUL. The control signal generation circuit 21 may generate the first control signal CON<1> and the second control signal CON<2> which are simultaneously enabled in response to the burst length information signal BLIF and the pulse signal PUL. The pulse signal PUL may be set to include a plurality of pulses, each of which is created during a predetermined period whenever the command is inputted to the second semiconductor device 2.

The input control signal generation circuit 22 may generate first to eighth high-order input control signals PINU<1:8> which are enabled in response to the first control signal CON<1>. The input control signal generation circuit 22 may generate the first to eighth high-order input control signals PINU<1:8> which are enabled if the first control signal CON<1> is enabled. The input control signal generation circuit 22 may generate first to eighth low-order input control signals PIND<1:8> which are enabled in response to the second control signal CON<2>. The input control signal generation circuit 22 may generate the first to eighth low-order input control signals PIND<1:8> which are enabled if the second control signal CON<2> is enabled.

The output control signal generation circuit 23 may generate first to eighth high-order output control signals POUTU<1:8> which are enabled in response to the first control signal CON<1>. The output control signal generation circuit 23 may generate the first to eighth high-order output control signals POUTU<1:8> which are enabled if the first control signal CON<1> is enabled. The output control signal generation circuit 23 may generate first to eighth low-order output control signals POUTD<1:8> which are enabled in response to the second control signal CON<2>. The output control signal generation circuit 23 may generate the first to eighth low-order output control signals POUTD<1:8> which are enabled if the second control signal CON<2> is enabled. The first to eighth high-order output control signals POUTU<1:8> may be enabled after the first to eighth high-order input control signals PINU<1:8> are enabled. In addition, the first to eighth low-order output control signals POUTD<1:8> may be enabled after the first to eighth low-order input control signals PIND<1:8> are enabled.

The pipe latch circuit 24 may latch the first and second groups of data D<1:16> in response to the first to eighth high-order input control signals PINU<1:8> and the first to eighth low-order input control signals PIND<1:8> and may output the latched first and second groups of data D<1:16> as the first and second groups of latched data LD<1:16> in response to the first to eighth high-order output control signals POUTU<1:8> and the first to eighth low-order output control signals POUTD<1:8>. The pipe latch circuit 24 may latch the first group of data D<1:8> if the first to eighth high-order input control signals PINU<1:8> are enabled. The pipe latch circuit 24 may latch the second group of data D<9:16> if the first to eighth low-order input control signals PIND<1:8> are enabled. The pipe latch circuit 24 may output the latched first group of data D<1:8> as the first group of latched data LD<1:8> if the first to eighth high-order output control signals POUTU<1:8> are enabled. The pipe latch circuit 24 may output the latched second group of data D<9:16> as the second group of latched data LD<9:16> if the first to eighth low-order output control signals POUTD<1:8> are enabled.

Figure 3:
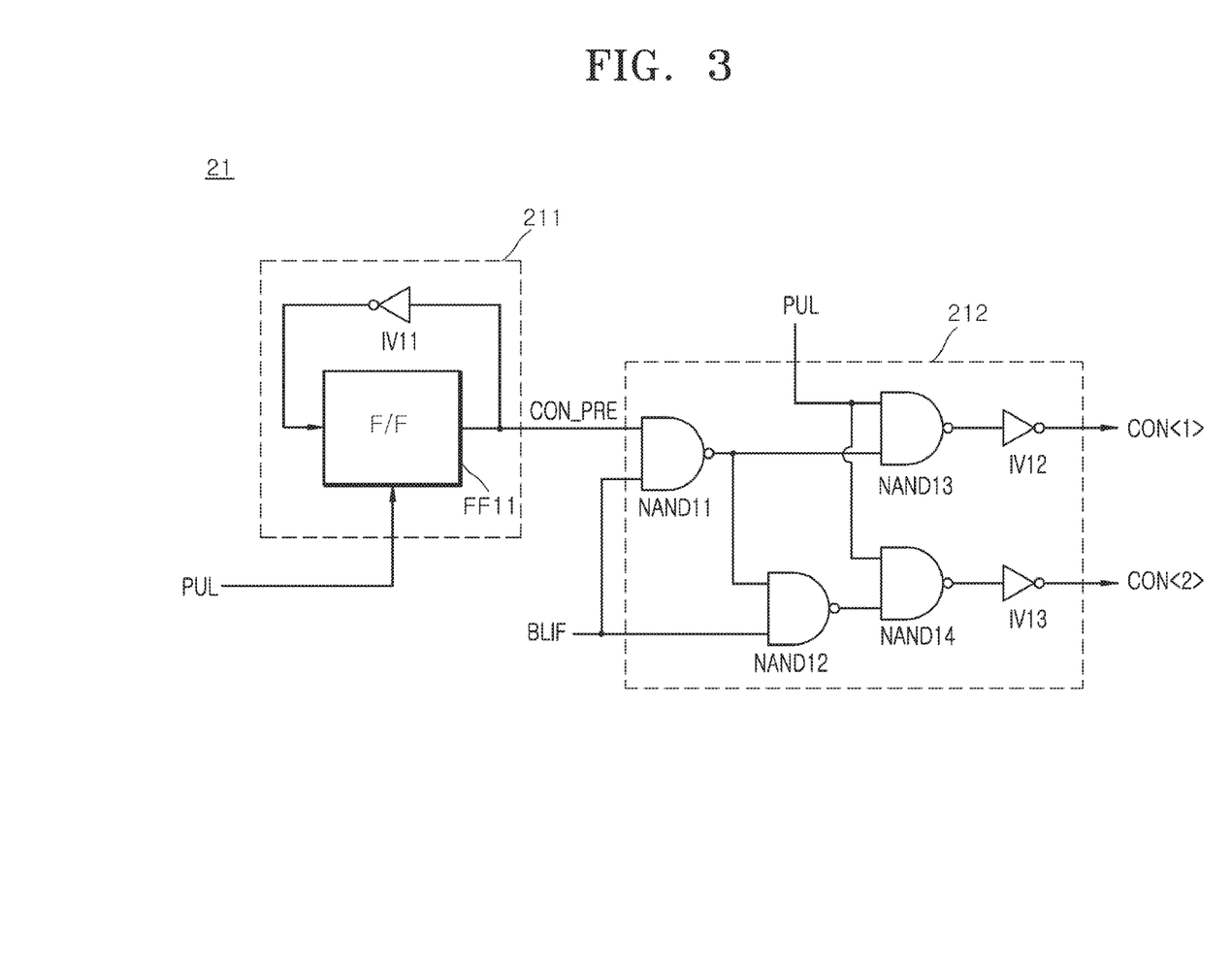
FIG. 3 is a circuit diagram illustrating an example of a control signal generation circuit included in the data processing circuit of FIG. 2.

Referring to FIG. 3, the control signal generation circuit 21 may include a pre-control signal generation circuit 211 and a control signal output circuit 212.

The pre-control signal generation circuit 211 may be realized using an inverter IV11 and a flip-flop FF11. The pre-control signal generation circuit 211 may generate a pre-control signal CON_PRE whose level changes in response to the pulse signal PUL. The pre-control signal generation circuit 211 may generate the pre-control signal CON_PRE whose level changes if a pulse of the pulse signal PUL is inputted to the pre-control signal generation circuit 211.

The control signal output circuit 212 may be realized using NAND gates NAND11, NAND12, NAND13, and NAND14 and inverters IV12 and IV13. The control signal output circuit 212 may generate the first control signal CON<1> and the second control signal CON<2> which are simultaneously enabled in response to the pulse signal PUL, if the burst length information signal BLIF is disabled. The control signal output circuit 212 may generate the first control signal CON<1> and the second control signal CON<2> which are simultaneously enabled to have a logic "high" level in response to a pulse of the pulse signal PUL, if the burst length information signal BLIF is disabled to have a logic "low" level. The control signal output circuit 212 may generate the first control signal CON<1> and the second control signal CON<2>, one of which is selectively enabled according to a logic level of the pre-control signal CON_PRE in response to the pulse signal PUL, if the burst length information signal BLIF is enabled. The control signal output circuit 212 may generate the first control signal CON<1> which is enabled to have a logic "high" level in response to a pulse of the pulse signal PUL if the burst length information signal BLIF is enabled to have a logic "high" level and the pre-control signal CON_PRE is generated to have a logic "low" level. The control signal output circuit 212 may generate the second control signal CON<2> which is enabled to have a logic "high" level in response to a pulse of the pulse signal PUL if the burst length information signal BLIF is enabled to have a logic "high" level and the pre-control signal CON_PRE is generated to have a logic "high" level.

Figure 4:
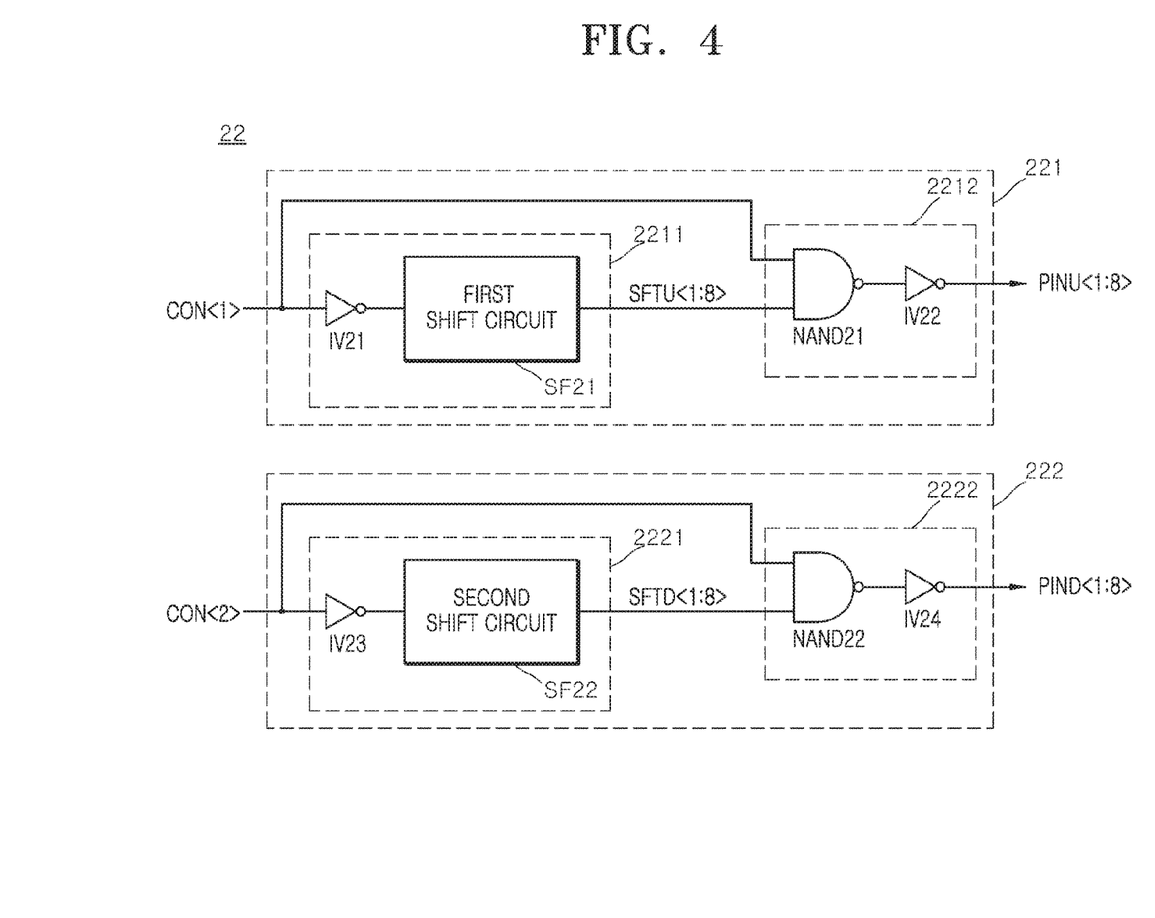
FIG. 4 is a block diagram illustrating an example of an input control signal generation circuit included in the data processing circuit of FIG. 2.

Referring to FIG. 4, the input control signal generation circuit 22 may include a high-order input control signal generation circuit 221 and a low-order input control signal generation circuit 222.

The high-order input control signal generation circuit 221 may include a first shift signal generation circuit 2211 and a first logic circuit 2212.

The first shift signal generation circuit 2211 may be realized using an inverter IV21 and a first shift circuit SF21. The first shift signal generation circuit 2211 may generate first to eighth high-order shift signals SFTU<1:8> in response to the first control signal CON<1>. The first shift signal generation circuit 2211 may generate the first to eighth high-order shift signals SFTU<1:8> which are enabled if the first control signal CON<1> is enabled to have a logic "high" level. The first shift signal generation circuit 2211 may generate the first to eighth high-order shift signals SFTU<1:8> which are simultaneously enabled to have a logic "high" level if the first control signal CON<1> is enabled to have a logic "high" level. In FIG. 4, the first shift signal generation circuit 2211 is illustrated with a single circuit comprised of the inverter IV21 and the first shift circuit SF21. However, the first shift signal generation circuit 2211 may actually be configured to include the same number of circuits as bits included in the first to eighth high-order shift signals SFTU<1:8>. That is, because the first to eighth high-order shift signals SFTU<1:8> include eight bits, the first shift signal generation circuit 2211 may be configured to include eight circuits, each of which is comprised of the inverter IV21 and the first shift circuit SF21.

The first logic circuit 2212 may be realized using a NAND gate NAND21 and an inverter IV22. The first logic circuit 2212 may buffer the first to eighth high-order shift signals SFTU<1:8> to generate the first to eighth high-order input control signals PINU<1:8>, in response to the first control signal CON<1>. The first logic circuit 2212 may buffer the first to eighth high-order shift signals SFTU<1:8> to generate the first to eighth high-order input control signals PINU<1:8>, if the first control signal CON<1> is enabled to have a logic "high" level. In FIG. 4, the first logic circuit 2212 is illustrated with a single circuit comprised of the NAND gate NAND21 and the inverter IV22. However, the first logic circuit 2212 may actually be configured to include the same number of circuits as bits included in the first to eighth high-order input control signals PINU<1:8>. That is, because the first to eighth high-order input control signals PINU<1:8> include eight bits, the first logic circuit 2212 may be configured to include eight circuits, each of which is comprised of the NAND gate NAND21 and the inverter IV22.

As described above, the high-order input control signal generation circuit 221 may generate the first to eighth high-order input control signals PINU<1:8> which are enabled in response to the first control signal CON<1>. The high-order input control signal generation circuit 221 may generate the first to eighth high-order input control signals PINU<1:8> which are enabled if the first control signal CON<1> is enabled to have a logic "high" level.

The low-order input control signal generation circuit 222 may include a second shift signal generation circuit 2221 and a second logic circuit 2222.

The second shift signal generation circuit 2221 may be realized using an inverter IV23 and a second shift circuit SF22. The second shift signal generation circuit 2221 may generate first to eighth low-order shift signals SFTD<1:8> in response to the second control signal CON<2>. The second shift signal generation circuit 2221 may generate the first to eighth low-order shift signals SFTD<1:8> which are enabled if the second control signal CON<2> is enabled to have a logic "high" level. The second shift signal generation circuit 2221 may generate the first to eighth low-order shift signals SFTD<1:8> which are simultaneously enabled to have a logic "high" level if the second control signal CON<2> is enabled to have a logic "high" level. In FIG. 4, the second shift signal generation circuit 2221 is illustrated with a single circuit comprised of the inverter IV23 and the second shift circuit SF22. However, the second shift signal generation circuit 2221 may actually be configured to include the same number of circuits as bits included in the first to eighth low-order shift signals SFTD<1:8>. That is, because the first to eighth low-order shift signals SFTU<1:8> include eight bits, the second shift signal generation circuit 2221 may be configured to include eight circuits, each of which is comprised of the inverter IV23 and the second shift circuit SF22.

The second logic circuit 2222 may be realized using a NAND gate NAND22 and an inverter IV24. The second logic circuit 2222 may buffer the first to eighth low-order shift signals SFTD<1:8> to generate the first to eighth low-order input control signals PIND<1:8>, in response to the second control signal CON<2>. The second logic circuit 2222 may buffer the first to eighth low-order shift signals SFTD<1:8> to generate the first to eighth low-order input control signals PIND<1:8>, if the second control signal CON<2> is enabled to have a logic "high" level. In FIG. 4, the second logic circuit 2222 is illustrated with a single circuit comprised of the NAND gate NAND22 and the inverter IV24. However, the second logic circuit 2222 may actually be configured to include the same number of circuits as bits included in the first to eighth low-order input control signals PIND<1:8>. That is, because the first to eighth low-order input control signals PIND<1:8> include eight bits, the second logic circuit 2222 may be configured to include eight circuits, each of which is comprised of the NAND gate NAND22 and the inverter IV24.

As described above, the low-order input control signal generation circuit 222 may generate the first to eighth low-order input control signals PIND<1:8> which are enabled in response to the second control signal CON<2>. The low-order input control signal generation circuit 222 may generate the first to eighth low-order input control signals PIND<1:8> which are enabled if the second control signal CON<2> is enabled to have a logic "high" level.

Figure 5:
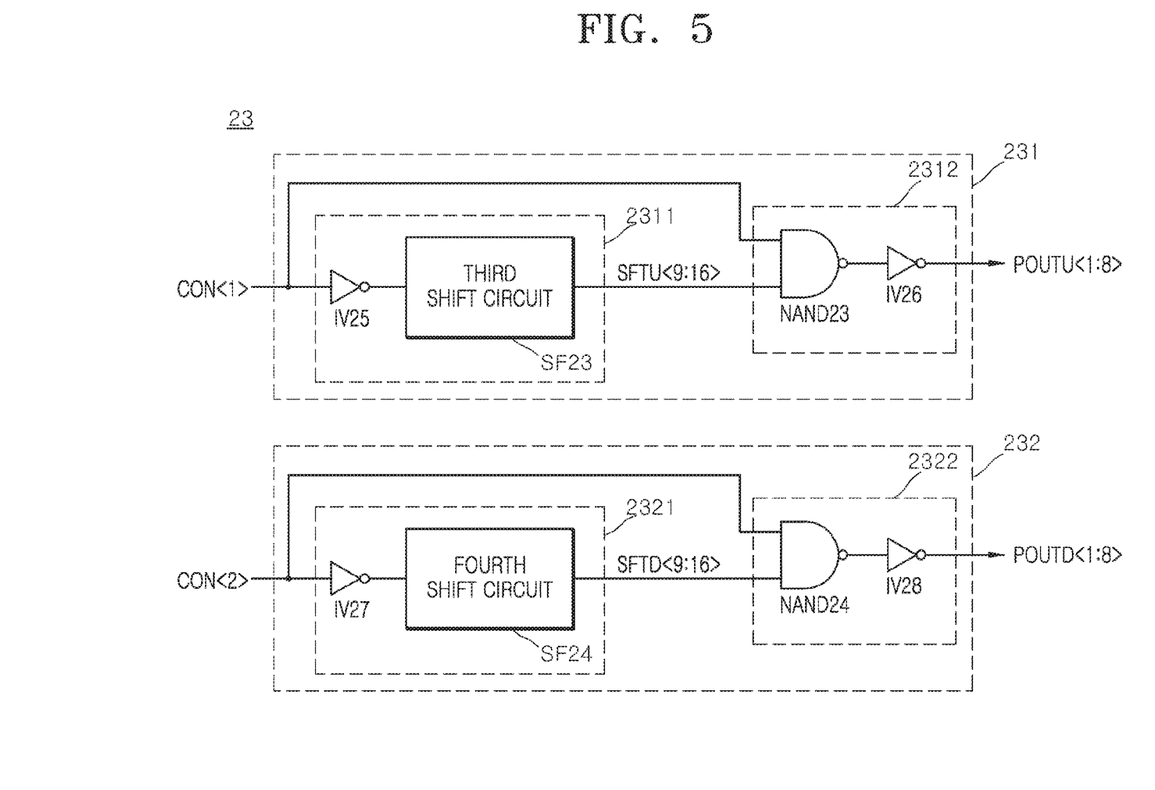
FIG. 5 is a block diagram illustrating an example of an output control signal generation circuit included in the data processing circuit of FIG. 2.

Referring to FIG. 5, the output control signal generation circuit 23 may include a high-order output control signal generation circuit 231 and a low-order output control signal generation circuit 232.

The high-order output control signal generation circuit 231 may include a third shift signal generation circuit 2311 and a third logic circuit 2312.

The third shift signal generation circuit 2311 may be realized using an inverter IV25 and a third shift circuit SF23.

The third shift signal generation circuit 2311 may generate ninth to sixteenth high-order shift signals SFTU<9:16> in response to the first control signal CON<1>. The third shift signal generation circuit 2311 may generate the ninth to sixteenth high-order shift signals SFTU<9:16> which are enabled if the first control signal CON<1> is enabled to have a logic "high" level. The third shift signal generation circuit 2311 may generate the ninth to sixteenth high-order shift signals SFTU<9:16> which are simultaneously enabled to have a logic "high" level if the first control signal CON<1> is enabled to have a logic "high" level. The third shift circuit SF23 may have a delay time which is longer than a delay time of the first shift circuit SF21 illustrated in FIG. 4. Thus, the third shift signal generation circuit 2311 may generate the ninth to sixteenth high-order shift signals SFTU<9:16> which are enabled after the first to eighth high-order shift signals SFTU<1:8> are enabled, in response to the first control signal CON<1>. In FIG. 5, the third shift signal generation circuit 2311 is illustrated with a single circuit comprised of the inverter IV25 and the third shift circuit SF23. However, the third shift signal generation circuit 2311 may actually be configured to include the same number of circuits as bits included in the ninth to sixteenth high-order shift signals SFTU<9:16>. That is, because the ninth to sixteenth high-order shift signals SFTU<9:16> include eight bits, the third shift signal generation circuit 2311 may be configured to include eight circuits, each of which is comprised of the inverter IV25 and the third shift circuit SF23.

The third logic circuit 2312 may be realized using a NAND gate NAND23 and an inverter IV26. The third logic circuit 2312 may buffer the ninth to sixteenth high-order shift signals SFTU<9:16> to generate the first to eighth high-order output control signals POUTU<1:8>, in response to the first control signal CON<1>. The third logic circuit 2312 may buffer the ninth to sixteenth high-order shift signals SFTU<9:16> to generate the first to eighth high-order output control signals POUTU<1:8>, if the first control signal CON<1> is enabled to have a logic "high" level. In FIG. 5, the third logic circuit 2312 is illustrated with a single circuit comprised of the NAND gate NAND23 and the inverter IV26. However, the third logic circuit 2312 may actually be configured to include the same number of circuits as bits included in the first to eighth high-order output control signals POUTU<1:8>. That is, because the first to eighth high-order output control signals POUTU<1:8> include eight bits, the third logic circuit 2312 may be configured to include eight circuits, each of which is comprised of the NAND gate NAND23 and the inverter IV26.

As described above, the high-order output control signal generation circuit 231 may generate the first to eighth high-order output control signals POUTU<1:8> which are enabled in response to the first control signal CON<1>. The high-order output control signal generation circuit 231 may generate the first to eighth high-order output control signals POUTU<1:8> which are enabled if the first control signal CON<1> is enabled to have a logic "high" level. The high-order output control signal generation circuit 231 may generate the first to eighth high-order output control signals POUTU<1:8> which are enabled after the first to eighth high-order input control signals PINU<1:8> are enabled, in response to the first control signal CON<1>.

The low-order output control signal generation circuit 232 may include a fourth shift signal generation circuit 2321 and a fourth logic circuit 2322.

The fourth shift signal generation circuit 2321 may be realized using an inverter IV27 and a fourth shift circuit SF24. The fourth shift signal generation circuit 2321 may generate ninth to sixteenth low-order shift signals SFTD<9:16> in response to the second control signal CON<2>. The fourth shift signal generation circuit 2321 may generate the ninth to sixteenth low-order shift signals SFTD<9:16> which are enabled if the second control signal CON<2> is enabled to have a logic "high" level. The fourth shift signal generation circuit 2321 may generate the ninth to sixteenth low-order shift signals SFTD<9:16> which are simultaneously enabled to have a logic "high" level if the second control signal CON<2> is enabled to have a logic "high" level. The fourth shift circuit SF24 may have a delay time which is longer than a delay time of the second shift circuit SF22 illustrated in FIG. 4. Thus, the fourth shift signal generation circuit 2321 may generate the ninth to sixteenth low-order shift signals SFTD<9:16> which are enabled after the first to eighth low-order shift signals SFTD<1:8> are enabled, in response to the second control signal CON<2>. In FIG. 5, the fourth shift signal generation circuit 2321 is illustrated with a single circuit comprised of the inverter IV27 and the fourth shift circuit SF24. However, the fourth shift signal generation circuit 2321 may actually be configured to include the same number of circuits as bits included in the ninth to sixteenth low-order shift signals SFTD<9:16>. That is, because the ninth to sixteenth low-order shift signals SFTD<9:16> include eight bits, the fourth shift signal generation circuit 2321 may be configured to include eight circuits, each of which is comprised of the inverter IV27 and the fourth shift circuit SF24.

The fourth logic circuit 2322 may be realized using a NAND gate NAND24 and an inverter IV28. The fourth logic circuit 2322 may buffer the ninth to sixteenth low-order shift signals SFTD<9:16> to generate the first to eighth low-order output control signals POUTD<1:8>, in response to the second control signal CON<2>. The fourth logic circuit 2322 may buffer the ninth to sixteenth low-order shift signals SFTD<9:16> to generate the first to eighth low-order output control signals POUTD<1:8>, if the second control signal CON<2> is enabled to have a logic "high" level. In FIG. 5, the fourth logic circuit 2322 is illustrated with a single circuit comprised of the NAND gate NAND24 and the inverter IV28. However, the fourth logic circuit 2322 may actually be configured to include the same number of circuits as bits included in the first to eighth low-order output control signals POUTD<1:8>. That is, because the first to eighth low-order output control signals POUTD<1:8> include eight bits, the fourth logic circuit 2322 may be configured to include eight circuits, each of which is comprised of the NAND gate NAND24 and the inverter IV28.

As described above, the low-order output control signal generation circuit 232 may generate the first to eighth low-order output control signals POUTD<1:8> which are enabled in response to the second control signal CON<2>. The low-order output control signal generation circuit 232 may generate the first to eighth low-order output control signals POUTD<1:8> which are enabled if the second control signal CON <2> is enabled to have a logic "high" level. The low-order output control signal generation circuit 232 may generate the first to eighth low-order output control signals POUTD<1:8> which are enabled after the first to eighth low-order input control signals PIND<1:8> are enabled, in response to the second control signal CON<2>.

Figure 6:
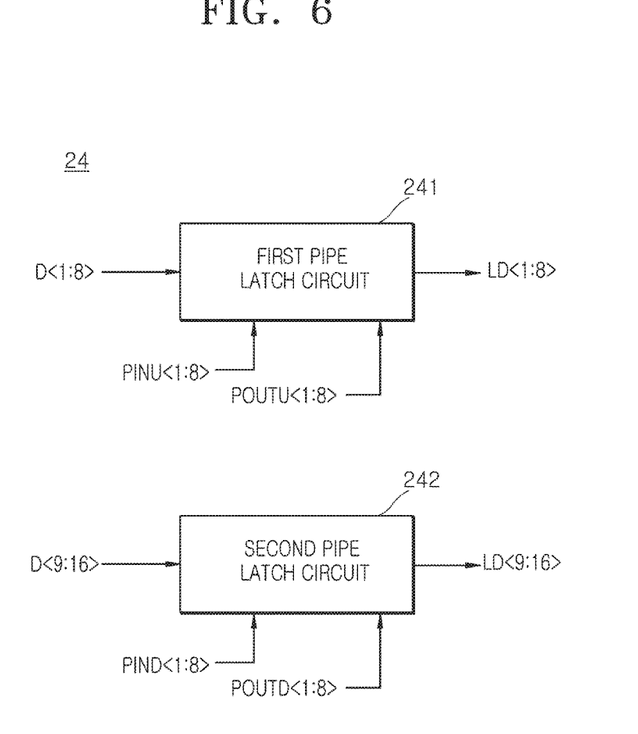
FIG. 6 is a block diagram illustrating an example of a pipe latch circuit included in the data processing circuit of FIG. 2.

Referring to FIG. 6, the pipe latch circuit 24 may include a first pipe latch circuit 241 and a second pipe latch circuit 242.

The first pipe latch circuit 241 may latch the first group of data D<1:8> in response to the first to eighth high-order input control signals PINU<1:8>, where the first group of data D<1:8> was loaded on the first group of I/O lines IO<1>. The first pipe latch circuit 241 may output the latched first group of data D<1:8> as the first group of latched data LD<1:8> in response to the first to eighth high-order output control signals POUTU<1:8>. The first pipe latch circuit 241 may be realized using a general pipe latch circuit including a plurality of latch circuits.

The second pipe latch circuit 242 may latch the second group of data D<9:16> in response to the first to eighth low-order input control signals PIND<1:8>, where the second group of data D<9:16> was loaded on the second group of I/O lines IO<2>. The second pipe latch circuit 242 may output the latched second group of data D<9:16> as the second group of latched data LD<9:16> in response to the first to eighth low-order output control signals POUTD<1:8>. The second pipe latch circuit 242 may be realized using a general pipe latch circuit including a plurality of latch circuits.

Figure 7:
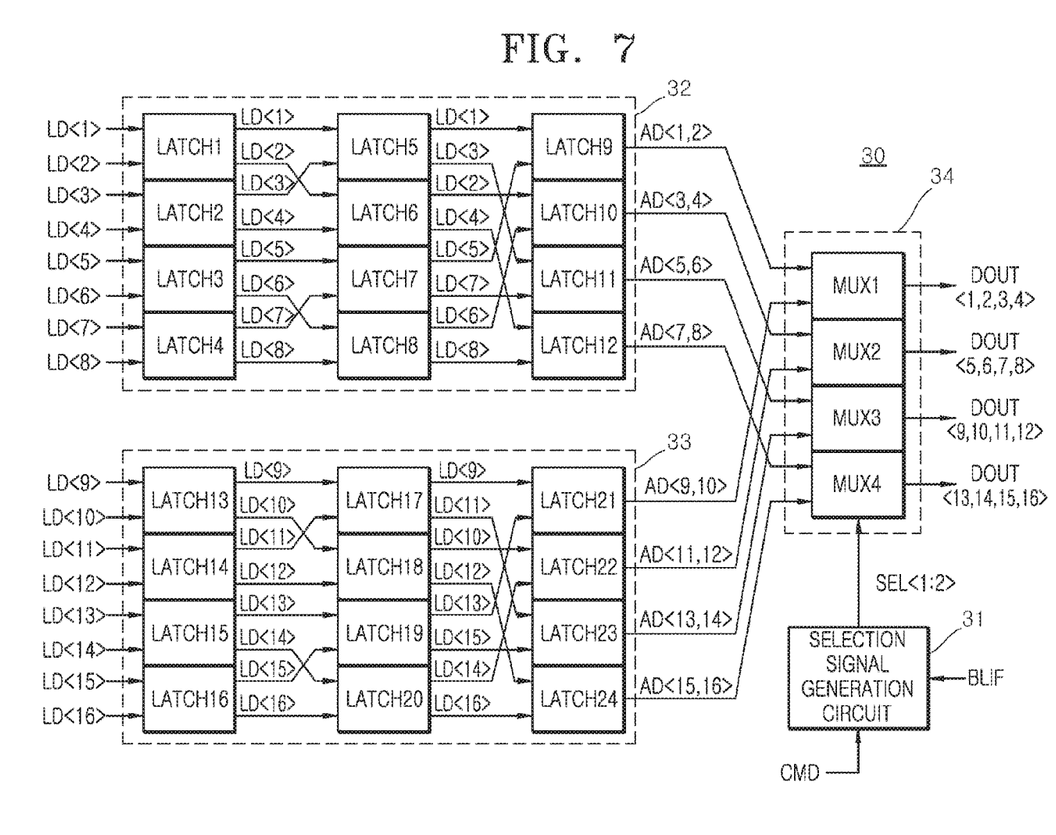
FIG. 7 is a block diagram illustrating an example of a data alignment circuit included in the semiconductor system of FIG. 1.

Referring to FIG. 7, the data alignment circuit 30 may include a selection signal generation circuit 31, a first aligned data generation circuit 32, a second aligned data generation circuit 33, and an output data generation circuit 34.

The selection signal generation circuit 31 may generate a first selection signal SEL<1> and a second selection signal SEL<2> which are enabled in response to the command CMD and the burst length information signal BLIF. The selection signal generation circuit 31 may generate the first selection signal SEL<1> which is enabled if the burst length information signal BLIF is disabled. The selection signal generation circuit 31 may generate the second selection signal SEL<2> whose level changes whenever the command CMD is inputted to the selection signal generation circuit 31 if the burst length information signal BLIF is enabled.

The first aligned data generation circuit 32 may be realized using a plurality of latches LATCH1~LATCH12 and may align the first group of latched data LD<1:8> to generate a first group of aligned data AD<1:8>. The first aligned data generation circuit 32 may latch the first group of latched data LD<1:8> and may change a sequence of the latched first group of latched data LD<1:8> to generate the first group of aligned data AD<1:8>. The first group of aligned data AD<1:8> may correspond to a portion of aligned data AD<1:16>.

Bits included in the first group of aligned data AD<1:8> generated by changing the sequence of the first group of latched data LD<1:8> will be described in detail hereinafter.

The aligned datum AD<1> may be generated by latching the latched datum LD<1> using the latches LATCH1, LATCH5, and LATCH9. The aligned datum AD<2> may be generated by latching the latched datum LD<5> using the latches LATCH3, LATCH7, and LATCH9. The aligned datum AD<3> may be generated by latching the latched datum LD<2> using the latches LATCH1, LATCH6, and LATCH10. The aligned datum AD<4> may be generated by latching the latched datum LD<6> using the latches LATCH3, LATCH8, and LATCH10. The aligned datum AD<5> may be generated by latching the latched datum LD<3> using the latches LATCH2, LATCH5, and LATCH11. The aligned datum AD<6> may be generated by latching the latched datum LD<7> using the latches LATCH4, LATCH7, and LATCH11. The aligned datum AD<7> may be generated by latching the latched datum LD<4> using the latches LATCH2, LATCH6, and LATCH12. The aligned datum AD<8> may be generated by latching the latched datum LD<8> using the latches LATCH4, LATCH8, and LATCH12.

The second aligned data generation circuit 33 may be realized using a plurality of latches LATCH13~LATCH24 and may align the second group of latched data LD<9:16> to generate a second group of aligned data AD<9:16>. The second aligned data generation circuit 33 may latch the second group of latched data LD<9:16> and may change a sequence of the latched second group of latched data LD<9:16> to generate the second group of aligned data AD<9:16>. The second group of aligned data AD<9:16> may correspond to the other portion of the aligned data AD<1:16>. The first and second groups of aligned data AD<1:8> and AD<9:16> constitute the aligned data AD<1:16>.

Bits included in the second group of aligned data AD<9:16> generated by changing the sequence of the second group of latched data LD<9:16> will be described in detail hereinafter.

The aligned datum AD<9> may be generated by latching the latched datum LD<9> using the latches LATCH13, LATCH17, and LATCH21. The aligned datum AD<10> may be generated by latching the latched datum LD<13> using the latches LATCH15, LATCH19, and LATCH21. The aligned datum AD<11> may be generated by latching the latched datum LD<10> using the latches LATCH13, LATCH18, and LATCH22. The aligned datum AD<12> may be generated by latching the latched datum LD<14> using the latches LATCH15, LATCH20, and LATCH22. The aligned datum AD<13> may be generated by latching the latched datum LD<11> using the latches LATCH14, LATCH17, and LATCH23. The aligned datum AD<14> may be generated by latching the latched datum LD<15> using the latches LATCH16, LATCH19, and LATCH23. The aligned datum AD<15> may be generated by latching the latched datum LD<12> using the latches LATCH14, LATCH18, and LATCH24. The aligned datum AD<16> may be generated by latching the latched datum LD<16> using the latches LATCH16, LATCH20, and LATCH24.

The output data generation circuit 34 may be realized using a plurality of multiplexers MUX1~MUX4 and may output the first and second groups of aligned data AD<1:16> as the output data DOUT<1:16>. The output data generation circuit 34 may output the first and second groups of aligned data AD<1:16> as the output data DOUT<1:16> in response to the first selection signal SEL<1>. The output data generation circuit 34 may output the first and second groups of aligned data AD<1:16> as the output data DOUT<1:16> if the first selection signal SEL<1> is enabled. The output data generation circuit 34 may output the first and second groups of aligned data AD<1:16> as the output data DOUT<1:16> in response to the second selection signal SEL<2>. The output data generation circuit 34 may output the first group of aligned data AD<1:8> as the output data DOUT<1,2,5,6,9,10,13,14> if the second selection signal SEL<2> is disabled to have a logic "low" level. The output data generation circuit 34 may output the second group of aligned data AD<9:16> as the output data DOUT<3,4,7,8,11,12,15,16> if the second selection signal SEL<2> is enabled to have a logic "high" level.

Bits included in the output data DOUT<1:16> generated from the first and second groups of aligned data AD<1:16> will be described in detail hereinafter.

The output datum DOUT<1> may be generated by transmitting the aligned datum AD<1> through the multiplexer MUX1. The output datum DOUT<2> may be generated by transmitting the aligned datum AD<2> through the multiplexer MUX1. The output datum DOUT<3> may be generated by transmitting the aligned datum AD<9> through the multiplexer MUX1. The output datum DOUT<4> may be generated by transmitting the aligned datum AD<10> through the multiplexer MUX1. The output datum DOUT<5> may be generated by transmitting the aligned datum AD<3> through the multiplexer MUX2. The output datum DOUT<6> may be generated by transmitting the aligned datum AD<4> through the multiplexer MUX2. The output datum DOUT<7> may be generated by transmitting the aligned datum AD<11> through the multiplexer MUX2. The output datum DOUT<8> may be generated by transmitting the aligned datum AD<12> through the multiplexer MUX2. The output datum DOUT<9> may be generated by transmitting the aligned datum AD<5> through the multiplexer MUX3. The output datum DOUT<10> may be generated by transmitting the aligned datum AD<6> through the multiplexer MUX3. The output datum DOUT<11> may be generated by transmitting the aligned datum AD<13> through the multiplexer MUX3. The output datum DOUT<12> may be generated by transmitting the aligned datum AD<14> through the multiplexer MUX3. The output datum DOUT<13> may be generated by transmitting the aligned datum AD<7> through the multiplexer MUX4. The output datum DOUT<14> may be generated by transmitting the aligned datum AD<8> through the multiplexer MUX4. The output datum DOUT<15> may be generated by transmitting the aligned datum AD<15> through the multiplexer MUX4. The output datum DOUT<16> may be generated by transmitting the aligned datum AD<16> through the multiplexer MUX4.

The read operation of the semiconductor system having the aforementioned configuration will be described hereinafter in conjunction with an example in which the burst length is set to be eight (i.e., BL=8) and an example in which the burst length is set to be sixteen (i.e., BL=16).

First, the read operation of the semiconductor system will be described hereinafter in conjunction with an example in which the burst length is set to be eight (i.e., BL=8).

The first semiconductor device 1 may output the command CMD, the address ADD, and the burst length information signal BLIF which is enabled to have a logic "high" level. The command CMD may be set as a read command for executing the read operation.

The memory circuit 10 may output the first group of data D<1:8> to the first group of I/O lines IO<1> in response to the command CMD and the address ADD.

The data processing circuit 20 may latch the first group of data D<1:8> loaded on the first group of I/O lines IO<1> to generate the first group of latched data LD<1:8>, in response to the burst length information signal BLIF having a logic "high" level.

The data alignment circuit 30 may latch and align the first group of latched data LD<1:8> to generate the output data DOUT<1,2,5,6,9,10,13,14>, in response to the command CMD and the burst length information signal BLIF having a logic "high" level.

The first semiconductor device 1 may receive the output data DOUT<1,2,5,6,9,10,13,14>.

The first semiconductor device 1 may output the command CMD, the address ADD, and the burst length information signal BLIF which is enabled to have a logic "high" level. The command CMD may be set as a read command for executing the read operation.

The memory circuit 10 may output the second group of data D<9:16> to the second group of I/O lines IO<2> in response to the command CMD and the address ADD.

The data processing circuit 20 may latch the second group of data D<9:16> loaded on the second group of I/O lines IO<2> to generate the second group of latched data LD<9:16>, in response to the burst length information signal BLIF having a logic "high" level.

The data alignment circuit 30 may latch and align the second group of latched data LD<9:16> to generate the output data DOUT<3,4,7,8,11,12,15,16>, in response to the command CMD and the burst length information signal BLIF having a logic "high" level.

The first semiconductor device 1 may receive the output data DOUT<3,4,7,8,11,12,15,16>.

Next, the read operation of the semiconductor system will be described hereinafter in conjunction with an example in which the burst length is set to be sixteen (i.e., BL=16).

The first semiconductor device 1 may output the command CMD, the address ADD, and the burst length information signal BLIF which is disabled to have a logic "low" level. The command CMD may be set as a read command for executing the read operation.

The memory circuit 10 may output the first group of data D<1:8> to the first group of I/O lines IO<1> and may output the second group of data D<9:16> to the second group of I/O lines IO<2>, in response to the command CMD and the address ADD.

The data processing circuit 20 may latch the first group of data D<1:8> loaded on the first group of I/O lines IO<1> to generate the first group of latched data LD<1:8>, in response to the burst length information signal BLIF having a logic "low" level. In addition, the data processing circuit 20 may latch the second group of data D<9:16> loaded on the second group of I/O lines IO<2> to generate the second group of latched data LD<9:16>, in response to the burst length information signal BLIF having a logic "low" level.

The data alignment circuit 30 may latch and align the first and second groups of latched data LD<1:16> to generate the output data DOUT<1:16>, in response to the command CMD and the burst length information signal BLIF having a logic "low" level.

The first semiconductor device 1 may receive the output data DOUT<1:16>.

As described above, a semiconductor system according to an embodiment may selectively or simultaneously drive I/O lines according to a burst length to transmit data. Thus, the data may be transmitted through the same pipe latch circuit regardless of the burst length.

Figure 8:
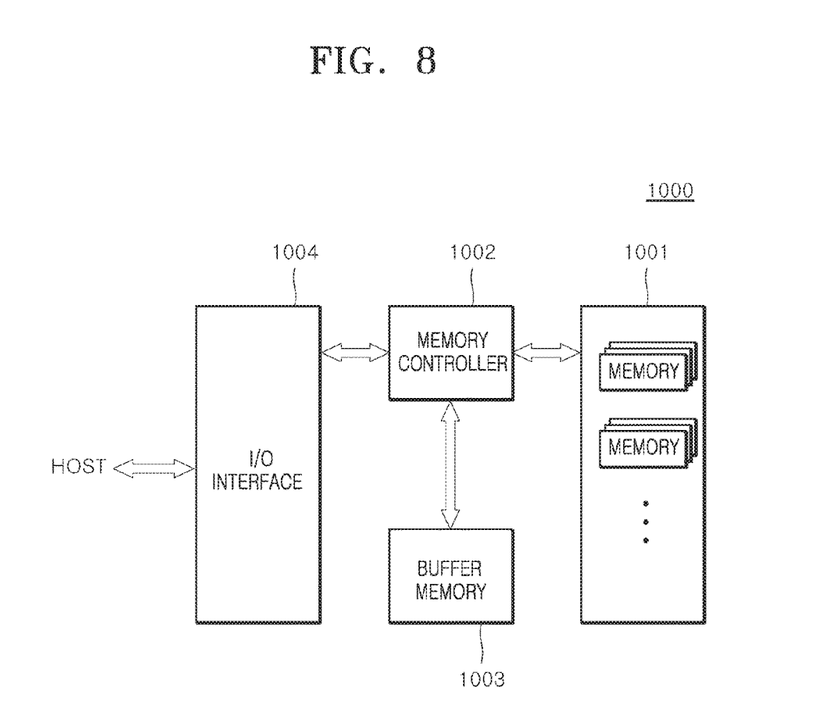
FIG. 8 is a block diagram illustrating a configuration of an electronic system employing the semiconductor system described with reference to FIGS. 1 to 7.

The semiconductor system described with reference to FIGS. 1 to 7 may be applied to an electronic system that includes a memory system, a graphic system, a computing system, a mobile system, or the like. For example, as illustrated in FIG. 8, an electronic system 1000 according an embodiment may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002, according to a control signal outputted from the memory controller 1002. The data storage circuit 1001 may include the second semiconductor device 2 illustrated in FIG. 1. Meanwhile, the data storage circuit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor device 1 illustrated in FIG. 1. Although FIG. 8 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which is outputted from or to be inputted to the data storage circuit 1001. The buffer memory 1003 may store the data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:
1. A semiconductor system comprising:
    a semiconductor device configured to generate first group of data and second group of data in response to a command and an address, and
    wherein, the semiconductor device configured to sequentially latch the first group of data loaded on a first group of I/O lines and the second group of data loaded on a second group of I/O lines to generate output data in response to a burst length information signal or to simultaneously latch the first and second groups of data loaded on the first and second groups of I/O lines to generate the output data in response to the burst length information signal.

2. The semiconductor system of claim 1, wherein the burst length information signal is a signal including information on the number of bits of the first and second groups of data which are generated in the semiconductor device during a period that the command is inputted to the semiconductor device once.

3. The semiconductor system of claim 1, wherein the semiconductor device is configured to output the first group of data or the second group of data as the output data in response to the command if the burst length information signal is enabled and configured to simultaneously output the first and second groups of data as the output data in response to the command if the burst length information signal is disabled.

4. The semiconductor system of claim 1, wherein the semiconductor device includes:
a memory circuit configured to output the first and second groups of data to the first and second groups of I/O lines in response to the command and the address;
a data processing circuit configured to sequentially latch the first group of data loaded on the first group of I/O lines and the second group of data loaded on the second group of I/O lines to generate a first group of latched data and a second group of latched data or configured to simultaneously latch the first and second groups of data loaded on the first and second groups of I/O lines to generate the first and second groups of latched data, in response to the burst length information signal; and
a data alignment circuit configured to latch and align the first and second groups of latched data to generate the output data in response to the command and the burst length information signal.

5. The semiconductor system of claim 4, wherein the data processing circuit includes:
a control signal generation circuit configured to generate a first control signal and a second control signal which are sequentially or simultaneously enabled in response to the burst length information signal and a pulse signal;
an input control signal generation circuit configured to generate high-order input control signals which are enabled in response to the first control signal and configured to generate low-order input control signals which are enabled in response to the second control signal;
an output control signal generation circuit configured to generate high-order output control signals which are enabled in response to the first control signal and configured to generate low-order output control signals which are enabled in response to the second control signal; and
a pipe latch circuit configured to latch the first and second groups of data in response to the high-order input control signals and the low-order input control signals and configured to output the latched first and second groups of data as the first and second groups of latched data in response to the high-order output control signals and the low-order output control signals.

6. The semiconductor system of claim 5, wherein the pulse signal is a signal including a pulse which is created during a predetermined period whenever the command is inputted to the semiconductor device.

7. The semiconductor system of claim 5, wherein the control signal generation circuit include:

a pre-control signal generation circuit configured to generate a pre-control signal whose level changes in response to the pulse signal; and
a control signal output circuit configured to generate the first and second control signals which are simultaneously enabled in response to the pulse signal if the burst length information signal is disabled and configured to generate the first and second control signals which are selectively enabled according to a level of the pre-control signal in response to the pulse signal if the burst length information signal is enabled.

8. The semiconductor system of claim 5, wherein the input control signal generation circuit includes:
a high-order input control signal generation circuit configured to generate the high-order input control signals which are enabled in response to the first control signal; and
a low-order input control signal generation circuit configured to generate the low-order input control signals which are enabled in response to the second control signal.

9. The semiconductor system of claim 5, wherein the output control signal generation circuit includes:
a high-order output control signal generation circuit configured to generate the high-order output control signals which are enabled in response to the first control signal; and
a low-order output control signal generation circuit configured to generate the low-order output control signals which are enabled in response to the second control signal.

10. The semiconductor system of claim 5, wherein the pipe latch circuit includes:
a first pipe latch circuit configured to latch the first group of data in response to the high-order input control signals and configured to output the latched first group of data as the first group of latched data in response to the high-order output control signals; and
a second pipe latch circuit configured to latch the second group of data in response to the low-order input control signals and configured to output the latched second group of data as the second group of latched data in response to the low-order output control signals.

11. The semiconductor system of claim 4, wherein the data alignment circuit includes:
a selection signal generation circuit configured to generate a first selection signal which is enabled if the burst length information signal is disabled and configured to generate a second selection signal whose level changes whenever the command is inputted to the selection signal generation circuit if the burst length information signal is enabled;
a first aligned data generation circuit configured to align the first group of latched data to generate a first group of aligned data;
a second aligned data generation circuit configured to align the second group of latched data to generate a second group of aligned data; and
an output data generation circuit configured to output the first and second groups of aligned data as the output data in response to the first selection signal and configured to output the first group of aligned data or the second group of aligned data as the output data according to a level of the second selection signal.

12. A semiconductor device comprising:
a data processing circuit configured to sequentially latch a first group of data loaded on a first group of input/ output (I/O) lines and a second group of data loaded on a second group of I/O lines to generate a first group of latched data and a second group of latched data in response to a burst length information signal or configured to simultaneously latch the first and second groups of data loaded on the first and second groups of I/O lines to generate the first and second groups of latched data in response to the burst length information signal; and a data alignment circuit configured to align the first and second groups of latched data to generate output data.

13. The semiconductor device of claim 12, wherein the burst length corresponds to the number of bits included in the output data outputted from the data alignment circuit during a period that a command provided by an external device is inputted to the data alignment circuit once.

14. The semiconductor device of claim 12, wherein the data processing circuit includes:
a control signal generation circuit configured to generate a first control signal and a second control signal which are sequentially or simultaneously enabled in response to the burst length information signal and a pulse signal;
an input control signal generation circuit configured to generate high-order input control signals which are enabled in response to the first control signal and configured to generate low-order input control signals which are enabled in response to the second control signal;
an output control signal generation circuit configured to generate high-order output control signals which are enabled in response to the first control signal and configured to generate low-order output control signals which are enabled in response to the second control signal; and
a pipe latch circuit configured to latch the first and second groups of data in response to the high-order input control signals and the low-order input control signals and configured to output the latched first and second groups of data as the first and second groups of latched data in response to the high-order output control signals and the low-order output control signals.

15. The semiconductor device of claim 14, wherein the burst length information signal is enabled if the burst length is set to be half the number of total bits included in the first and second groups of data.

16. The semiconductor device of claim 14, wherein the control signal generation circuit include:
a pre-control signal generation circuit configured to generate a pre-control signal whose level changes in response to the pulse signal; and
a control signal output circuit configured to generate the first and second control signals which are simultaneously enabled in response to the pulse signal if the burst length information signal is disabled and configured to generate the first and second control signals which are selectively enabled according to a level of the pre-control signal in response to the pulse signal if the burst length information signal is enabled.

17. The semiconductor device of claim 14, wherein the input control signal generation circuit includes:
a high-order input control signal generation circuit configured to generate the high-order input control signals which are enabled in response to the first control signal; and
a low-order input control signal generation circuit configured to generate the low-order input control signals which are enabled in response to the second control signal.

18. The semiconductor device of claim 14, wherein the output control signal generation circuit includes:
a high-order output control signal generation circuit configured to generate the high-order output control signals which are enabled in response to the first control signal; and
a low-order output control signal generation circuit configured to generate the low-order output control signals which are enabled in response to the second control signal.

19. The semiconductor device of claim 14, wherein the pipe latch circuit includes:
a first pipe latch circuit configured to latch the first group of data in response to the high-order input control signals and configured to output the latched first group of data as the first group of latched data in response to the high-order output control signals; and
a second pipe latch circuit configured to latch the second group of data in response to the low-order input control signals and configured to output the latched second group of data as the second group of latched data in response to the low-order output control signals.

20. The semiconductor device of claim 12, wherein the data alignment circuit includes:
a selection signal generation circuit configured to generate a first selection signal which is enabled if a burst length information signal is disabled and configured to generate a second selection signal whose level changes whenever a command is inputted to the selection signal generation circuit if the burst length information signal is enabled;
a first aligned data generation circuit configured to align the first group of latched data to generate a first group of aligned data;
a second aligned data generation circuit configured to align the second group of latched data to generate a second group of aligned data; and
an output data generation circuit configured to output the first and second groups of aligned data as the output data in response to the first selection signal and configured to output the first group of aligned data or the second group of aligned data as the output data according to a level of the second selection signal.

* * * * *